US012398466B2

(12) United States Patent
Rojek et al.

(10) Patent No.: US 12,398,466 B2
(45) Date of Patent: Aug. 26, 2025

(54) METHOD FOR EMISSIVITY-CORRECTED PYROMETRY

(71) Applicant: AIXTRON SE, Herzogenrath (DE)

(72) Inventors: Karsten Rojek, Mönchengladbach (DE); Dirk Heydhausen, Aachen (DE)

(73) Assignee: AIXTRON SE, Herzogenrath (DE)

( * ) Notice: Subject to any disclaimer, the term of this patent is extended or adjusted under 35 U.S.C. 154(b) by 77 days.

(21) Appl. No.: 18/030,734

(22) PCT Filed: Oct. 5, 2021

(86) PCT No.: PCT/EP2021/077333
§ 371 (c)(1),
(2) Date: Apr. 6, 2023

(87) PCT Pub. No.: WO2022/073951
PCT Pub. Date: Apr. 14, 2022

(65) Prior Publication Data
US 2023/0374664 A1    Nov. 23, 2023

(30) Foreign Application Priority Data

Oct. 9, 2020   (DE) ................. 10 2020 126 597.2

(51) Int. Cl.
*C23C 16/52*   (2006.01)
*C23C 16/46*   (2006.01)
*G01J 5/00*   (2022.01)

(52) U.S. Cl.
CPC .............. *C23C 16/52* (2013.01); *C23C 16/46* (2013.01); *G01J 5/0007* (2013.01)

(58) Field of Classification Search
CPC ................... C23C 16/52; C23C 16/46
See application file for complete search history.

(56) References Cited

U.S. PATENT DOCUMENTS 6,349,270 B1 *   2/2002   Gurary ................. G01J 5/0022
                                                     374/126
6,398,406 B1     6/2002   Breiland et al.

FOREIGN PATENT DOCUMENTS

DE    10 2018 106 481 A1   9/2019
JP        2018166204 A    10/2018
WO    WO-2019179762 A1 *   9/2019

OTHER PUBLICATIONS

International Search Report mailed Jan. 20, 2022, from the ISA/European Patent Office, for International Patent Application No. PCT/EP2021/077333 (filed Oct. 5, 2021), 8 pgs.

(Continued)

*Primary Examiner* — Kelly M Gambetta
(74) *Attorney, Agent, or Firm* — Ascenda Law Group, PC

(57) ABSTRACT

A substrate is coated with a multilayer structure which has layers of a first portion and layers of a second portion that are deposited on the layers of the first portion. During the deposition of at least one layer of the second portion, at least one optical measuring apparatus measures an emissivity value and a reflectance value on the broad side of the substrate, which broad side comprises the layer. Using a previously determined correction value, an actual value of a temperature of the broad side of the substrate is calculated and, using the actual value, a heating apparatus is controlled in order to control the temperature of the substrate to match a target value of the temperature of the broad side of the substrate. The correction value is determined during the deposition of the first portion, which is carried out immediately before the deposition of the second portion.

13 Claims, 3 Drawing Sheets

(56) References Cited

OTHER PUBLICATIONS

Written Opinion mailed Jan. 20, 2022, from the ISA/European Patent Office, for International Patent Application No. PCT/EP2021/077333 (filed Oct. 5, 2021), 10 pgs.

Written Opinion mailed Jan. 20, 2022, from the ISA/European Patent Office, for International Patent Application No. PCT/EP2021/077333 (filed Oct. 5, 2021), English translation, 8 pgs.

International Preliminary Report on Patentability issued Mar. 28, 2023, from The International Bureau of WIPO, for International Patent Application PCT/EP2021/077333 (filed Oct. 5, 2021), 20 pgs.

Breiland, "Reflectance-correcting pyrometry in thin film deposition applications", Sandia National Lab.(SNL-NM), Albuquerque, NM (United States); Sandia National Laboratories, Jun. 2003, Sand Report, 85 pp.

Brunner; et al., "Advanced in-situ control for III-nitride RF power device epitaxy," Semiconductor Science and Technology, 2018, 33:045014, 6 pp.

Gurary; et al., "Application of emissivity compensated pyrometry for temperature measurement and control during compound semiconductors manufacturing," AIP Conference Proceedings, 2003, 684(1):843-848.

Yan; et al., "In-Situ Temperature Monitoring and Deposition Induced Errors Calibration in Metal-Organic Chemical Vapor Deposition," 2013 Third International Conference on Instrumentation, Measurement, Computer, Communication and Control, 2013 IEEE, pp. 897-900.

\* cited by examiner

METHOD FOR EMISSIVITY-CORRECTED PYROMETRY

RELATED APPLICATIONS

This application is a National Stage under 35 USC 371 of and claims priority to International Application No. PCT/EP2021/077333, filed 5 Oct. 2021, which claims the priority benefit of DE Application No. 10 2020 126 597.2, filed 9 Oct. 2020.

FIELD OF THE INVENTION

The invention relates to a method for coating of substrates with a multilayer structure, which has a first portion and a second portion deposited on the first portion, wherein, during the deposition at least of the second portion, an emissivity value and a reflectance value on the broad side of the substrate on which the layer is situated is measured with at least one optical measuring device, wherein an actual value of a temperature of the broad side of the substrate is calculated using a previously determined correction value, and a heating device is regulated against a target value of the temperature of the broad side of the substrate using the actual value in order to control the temperature of the substrate.

The invention further relates to an apparatus for carrying out the method, the computing device is programmed in such manner that the correction value is determined during deposition of a first portion of the multilayer structure on the substrate immediately before the deposition of the second portion of the multilayer structure on the first layer arrangement.

BACKGROUND

U.S. Pat. No. 6,398,406 B1 constitutes the technical background of the invention. The method described there for emissivity-corrected pyrometry, also referred to as reflectivity- or reflectance-corrected or emissivity-compensated pyrometry, and the use thereof for contactless optical temperature measurement during thin film deposition with unknown and continuously changing optical properties of the measurement object. With the pyrometry method for contactless temperature measurement, use is made of the relationship between the thermal radiation emitted by the hot measurement object and the temperature of the object, which is described by the known Planck radiation equation and in practice is captured unambiguously except for the degree of emission of the object with a corresponding prior calibration. The measurement object may be any surface in the process chamber which is purposeful for monitoring or regulating the temperature and optically accessible. For this invention, the measurement object is in particular the surface of the substrate or substrates in the process chamber during the deposition process, during which a semiconductor layer structure is created with different, almost stoichiometric compounds from Group III (Al, Ga, In) and from nitrogen.

The prior art is also represented by the following publication (hereinafter, "Breiland 2003"):

BREILAND, WILLIAM G. *Reflectance-correcting pyrometry in thin film deposition applications*. No. SAND2003-1868. Sandia National Lab. (SNL-N4), Albuquerque, NM (United States) Sandia National Lab. (SNL-CA), Livermore, CA (United States), 2003.

The prior art also comprises DE 10 2018 106 481 A1, which describes a generic apparatus.

The known method for emissivity correction is based on determining the missing, unknown degree of emission by measuring the reflectance of the surface of the measurement object. In the case of light-opaque substrates, emissivity is determined with the aid of Kirchhoff's Law using the equation $\varepsilon = 1 - \rho$. The detection wavelength of the pyrometer is selected such that the chosen substrate (in this case silicon) is light-opaque for the wavelength at the typical operating temperatures (T=600-1200° C.), that is to say for a value in the range from 800 nm to 1000 nm. The reflectance is measured at exactly the same wavelength as the thermal emission, so that the method functions with sufficient accuracy. The light necessary for this may be supplied by a laser. In practice, pyrometers do not have a sharp measuring wavelength, but instead have a wavelength interval (about ±10 nm, but also narrower or wider). This interval width and the centroid wavelength of the emission and reflectance measurement must match each other as closely as possible. The reflectance is measured by emitting light of the defined wavelength at the location of the sensor, reflecting it upon vertical incidence on the wafer surface, and reflecting it to the extent possible at the same location as the pyrometer measurements. The reflectance is determined from the measured signal intensity of the reflected light with the aid of a preceding calibration. In practice, it is often not possible to measure the thermal emission and the reflectance of the object simultaneously, but in alternating temporally separate manner, so that the reflectance measurement does not interfere with the measurement of the thermal emission.

For the precise measurement of the temperature, two different calibration steps are necessary. Performing the calibrations enables the determination of calibration parameters, which are incorporated in the calculation of the temperature from the measurement signals. This is the calibration of the emission measurement using a blackbody radiation source (blackbody furnace, special reference sources), which creates the link between the intensity signal and measured temperature. During the measurement, the use of the calibration parameters obtained in this way enables the determination of the "raw temperature" which has not yet been corrected by the effect of the unknown emissivity. A calibration step independent of this is used to determine a calibration parameter, so that a reflectance value from the interval 0 . . . 1 is assigned to each measured reflectance signal. This calibration step is performed on substrates of well known reflectance (or emissivity in the case of opaque substrates), such as silicon immediately after the process step of desorption (native oxide removal) at a known temperature and with an uncontaminated surface and before the start of layer deposition.

The temperature in the measurement process is calculated initially as described in Breiland 2003, by:

$$\frac{1}{T_C} = \tau - \frac{\lambda}{c_2} \ln\left(\frac{E}{1-R}\right) \quad (1)$$

with $$\tau = \frac{1}{T_{cal}} - \frac{\lambda}{c_2} \ln\left(\frac{1-R_{cal}}{S_{cal}}\right) \quad (2)$$

The terms shown in the above expression represent the following variables:

$T_C$: Emissivity-corrected temperature

E: Calibrated signal of the measurement of the thermal emission (linear relationship between measurement signal and incident radiation)

R: Calibrated signal of the reflectance measurement (linear relationship between measurement signal and incident radiation)

$T_{cal}$, $S_{cal}$: Calibration parameters for determining the raw temperature $R_{cal}$: Calibration parameter of the reflectance measurement $\lambda$: Wavelength of pyrometer and reflectance measurement $c_2$: Second radiation constant The expressions may be simplified as follows:

$$T_C = \frac{B}{\log E - A + \log(1 - R)} \quad (3)$$

A, B Calibration parameters for determining the raw temperature

During deposition of a thin layer with constant growth rate, without the use of the known emissivity correction method described above, a sinusoidally oscillating temperature measurement is observed, which is associated with the interference effects in the translucent thin layer (Fabry-Perot oscillations). In the specific case of MOCVD deposition of GaN or AlGaN on silicon at temperatures in the range from 950 to 1100° C., the oscillations have values up to ±30° C. (see also FIG. 4). The objective of the method is to reduce the temperature oscillations to less than ±2° C., better still ±1° C.

If the temperature measurement method of the prior art described in Breiland 2003 is carried out as described, a number of errors occur, which will be described in the following text. All of these error sources result in the emissivity correction being performed incompletely or artificially elevated. The erroneous emissivity correction manifests itself as persistent temperature oscillations, whose amplitude is greater than the desired degree of error.

It has been shown that in particular the material system GaN (AlGaN) on silicon is particularly prone to the described error sources, because the values of the indices of refraction for the layer material and of the wafer material, as well as the meeting of translucent layer and opaque substrate cause the measured reflectance values R to oscillate between values of close to zero and 0.5.

The observed error sources may be following errors, which also occur in practice:

Unknown exact value of the reflectance of the calibration object during the reflectance calibration, so that the value of the reflectance used for the calibration does not match the physical reflectance, and the reflectance values used for the emissivity correction are incorrect.

Errors when adjusting and setting up the measurement optics.

Scattering at layer boundaries in the semiconductor layer structure when measuring the reflectance, so that a part of the actually reflected light is not captured.

Scattered radiation from hot surfaces of the process chamber, which gets into the measuring head due to multireflection on process chamber walls and on the wafer surface.

In the production of electronic components, such as transistors for circuits for power conversion or high-frequency amplification, the control and exact reproducibility of the deposition process and the yield of usable components per wafer with the embodiment of the known method on which the invention is based is significantly limited, because the measured wafer temperature is used for regulating the temperature in a closed control loop. The temperature regulation controls a heating device in such a way that the measured temperature constantly corresponds to a certain target value; the physical temperature then oscillates correspondingly about the persistent amplitude of the not fully corrected temperature oscillations, which represent a measurement artifact. The component has a multilayer structure which has been deposited on a substrate, and which has a first portion and a second portion. In the first portion, transition layers, in particular AlGaN, and buffer layers, in particular of GaN, are deposited. An AlGaN barrier layer is deposited on the GaN buffer layer in such a way that a two-dimensional electron gas forms in the area of the layer boundary between the GaN layer and the AlGaN barrier layer. The negative effect on reproducibility is due in particular to the fact that the component structure is typically assembled from a succession of functional blocks that consists of a thin AlN seed layer on the Si substrate, a transition layer sequence, a thick GaN buffer layer sequence, and a relatively thin but temperature-sensitive barrier layer of AlGaN or AlInN. At the end of the buffer layer, the deviation of the physical temperature from the target value will have different values from run to run or from wafer to wafer depending on the random phase situation of the persistent measurement temperature oscillation, which are translated for example into different values of the barrier layer composition that are critical for the component function.

In order to compensate for the error sources outlined above, the following theoretical correction for this measurement method is introduced in the prior art (Breiland 2003): The starting point for the approach is the mathematically deducible fact that the effect of a series of error sources can be compensated effectively with one additional correction value $\gamma$, so that the persistent oscillations may theoretically be reduced to a value approaching zero.

The correction is made as follows:

$$\frac{1}{T_C} = \tau - \frac{\lambda}{c_2} \ln\left(\frac{E}{1 - R + \gamma}\right) \quad (4)$$

with $$\tau = \frac{1}{T_{cal}} - \frac{\lambda}{c_2} \ln\left(\frac{1 - R_{cal} + \gamma}{S_{cal}}\right)$$

The mathematical equivalence of the introduced correction by the parameter $\gamma$ to correct the above mentioned error sources that occur may be shown in general form. In this context, $\gamma$ may be linearly dependent on R. The offset of $\gamma$ depends solely on reflections of the light source inside the measurement optics. The offset may be compensated with an additional calibration step. All further fractions are linearly dependent on R. In a simplified representation with $\gamma=\gamma(R)$, the expressions above may be reformulated as follows:

$$T_C = \frac{B}{\log E - A + \log(1 - \gamma \cdot R)} \quad (5)$$

In order to calculate the additional calibration parameter $\gamma$, in U.S. Pat. No. 6,398,406 B1 and Breiland 2003 it is suggested to carry out a complete coating run for a specific semiconductor structure, in which the greatest possible oscillation occurs, specifically a DBR structure (DBR=Distributed Bragg Reflector), and after the end of the run to adjust the parameter γ in such manner that the oscillations are reduced as far as possible. The value of the parameter γ may be determined either manually or by an optimization task (the minimum variance method) or by linear regression.

The known method has many drawbacks in a practical production setting, including for example:

The performance of a separate calibration run with corresponding production downtime.

While calculating the parameter γ, it is necessary to shut down the automatic temperature control.

While performing a calibration run with a special structure, only a reactor-specific parameter γ is calculated, a correction parameter γ for individual layers or component structures of different types is not determined. It is observed that the oscillation minimizing parameter γ may be different for different individual layers in the component structure.

Substantial personnel commitment as a consequence of the necessary frequent re-determination of the parameters.

Subjective assessment of adequate matching between the parameters in the case of manual determination.

SUMMARY OF THE INVENTION

The problem addressed by the invention is that of compensating for the errors and measurement artifacts that actually occur, leading to an oscillating temperature value during the calculation of the actual value, so that a minimally oscillating calculated variable is available for the regulation, at least during deposition of the second portion of the multilayer structure, which has one or more active regions, wherein in particular a separate deposition process for determining the correction value may be dispensed with.

The problem is solved by the invention described in the claims, wherein the subordinate claims not only represent advantageous further developments of the independent claims, but are also solutions to the problem on their own merits.

Firstly, and essentially, an emissivity value and a reflectance value is measured on the surface of the substrate in known manner. An emissivity value and a reflectance value may be measured at the same time. However, it is also possible to determine the emissivity value and the reflectance value in two immediately consecutive measurements. An emissivity-corrected actual temperature value may be determined with the formulas described above, and in particular formula (5) and the detailed description in Breiland 2003, which is incorporated in the content of the disclosure of this application. For this, when coating the substrate with a multilayer structure, which includes a first portion and a second portion deposited on the first portion, a correction value is determined during deposition of the first portion. This correction value is used for calculation of the actual value of the substrate temperature during deposition of the second portion. The method is carried out in an apparatus which includes a computing device, with which the correction value is first calculated according to the method described in the introduction. This is done according to the invention at the time of the deposition of the first portion of the multilayer structure, which may include transition layers of AlGaN and/or buffer layers of GaN. The correction value calculated immediately before the deposition of the second portion of the multilayer structure is used to determine the actual value of the substrate temperature during deposition of the second portion for regulation of the substrate temperature. The second portion of the multilayer structure preferably contains the active layers or layer regions of the multilayer structure. For example, the second portion may contain a top region of a buffer layer of GaN, and may comprise at least the bottom region of an AlGaN barrier or AlInN barrier, which is deposited on the buffer layer. The second portion of the multilayer structure contains in particular the regions of immediately adjoining layers, which may form a two-dimensional electron gas in the region of their boundary, so that the multilayer structure can be used for manufacturing field effect transistors.

Because of the further development according to the invention of the known method, it is no longer necessary to carry out a separate deposition process for calculating the correction value before performing the actual deposition process of the multilayer structure. The correction value is determined to some degree in situ during the deposition of the multilayer structure, in fact temporally before the deposition of the active region of the multilayer structure. It is further possible to determine an individual correction value for each substrate when depositing multiple substrates.

A preferred variant of the method consists in particular in that the first portion of the multilayer structure has a multiplicity of buffer or transition layers. The second portion of the multilayer structure preferably includes at least one barrier layer. The measurement of the emissivity value and/or of the reflectance value is preferably carried out at a wavelength in a range between 800 nm and 1000 nm. The substrate may be opaque for light at this wavelength. At least one region, preferably a layer of the first and of the second portion, is transparent for light at this wavelength.

The correction value is preferably calculated at a temperature of the substrate that is maintained temporally constant. For this purpose, the substrate may be heated with a constant heat output and without regulation of the substrate temperature. It may be provided that the substrate is brought in controlled manner to a target temperature prior to a correction value determination phase. For the reasons stated above, the measured substrate temperature may oscillate during this process. The regulation is interrupted with the result that the substrate is only heated with constant heat output. After a certain time, during which the temperature of the substrate reaches a steady state, a correction value is determined according to the method described in the introduction in Breiland 2003 and in U.S. Pat. No. 6,398,406 B1, in a correction value determination phase during which the temperature of the substrate is kept constant. The determination of the correction value may take place in a single step. However, it is also possible to keep the temperature of the substrate constant during the deposition of the first portion of the multilayer structure in several steps, each for determining an intermediate correction value. In this way, using the formulas (1-5) presented above, and in particular formula (5), the correction value, which may depend on the reflectance, is determined by means of a numerical optimization, for example by means of a linear regression, in such manner that the actual temperature $T_C$ described as calculated according to formula (5) exhibits a minimal oscillation. The temporal length for the correction value determination phase or the phase for determining an intermediate correction value is at least a quarter of a period of the oscillation and/or at least 40 seconds, typically about 100 seconds.

The calculation of the correction value may be carried out not only during the deposition of the first portion of the multilayer structure. A further calculation of the correction value may also take place during the deposition of the second portion, in particular in order to thus optimize the correction value that was obtained when the first portion was deposited.

Then, during the deposition of the second portion, the temperature measurement may be corrected with the correction value obtained in one or more steps during the deposition of the first portion of the multilayer structure. The calculation of both the correction value and subsequently of the actual value of the temperature may then be carried out by a program of the measuring device or by a program of the computing device. This may be carried out in automated fashion. The calculation of the correction value may be optimized continuously during the deposition of the first portion of the multilayer structure. The calculation of the correction value preferably takes place in a phase of the deposition of the component structure in which the automatic temperature regulation, with which the surface temperature of the substrate is maintained at as constant a value as possible, may be switched off with no adverse effect on the layer structure. The parameter determination for the calculation of the actual temperature also takes place preferably while the regulation is switched off. The temporal regions of the coating process in which a transition layer sequence is deposited between a seed layer and a buffer layer have proven to be particularly suitable in this respect. The beginning of the deposition of a buffer layer is also suitable for the parameter determination and determination of the correction value. A continuous calculation of the correction value during the deposition of the layer structure is advantageous, since the real physical temperature can remain sufficiently constant. Depending on the quality of the oscillation timelines, a fraction of a full oscillation period is already enough to allow the calculation of the correction value. This calculation would be a part of the control loop, and the determination of the calculation error may be used as an indication as to whether the automated calculation is used for the next partial portion or not.

It may also be provided to use the correction value calculated in a deposition process and/or the other parameters calculated during said process to determine the actual value of the substrate temperature in another deposition process, which follows the deposition process described originally.

The apparatus for carrying out the method includes a reactor housing and a gas inlet element arranged therein, with which process gases which may contain a hydride of an element from main group V and an organometallic compound of an element from main group III. The elements from main group V may be nitrogen, arsenic, phosphorus or tellurium. The elements from main group III may be aluminium, gallium or phosphorus. The process gases are fed into a process chamber together with an inert gas, for example hydrogen. The bottom of the process chamber may be formed by a susceptor. The substrates may be supported on the susceptor. But it is also provided that the susceptor includes one or more substrate carriers, particularly arranged on a circular arc about a center of the susceptor, on which at least one substrate rests. The gas inlet element may be arranged in the center of the process chamber. At the top, the process chamber is delimited by a process chamber ceiling. This may have an opening through which the beam path of an optical measuring device (e.g., a pyrometer, a laser or a plurality of pyrometers) passes. The beam path meets a substrate at a measurement point, so that the reflectance and the emissivity of the surface of the substrate, or of the layer deposited on the substrate can be determined with the pyrometer or pyrometers. According to the method described in the introduction, a temperature may be measured from the reflectance value and the emissivity value. Due to the oscillations of the measurement values used for the calculation of the actual temperature, which occur because of the changing layer thickness as a consequence of the constant layer growth, a correction with the method described above is necessary. This is done using a computing device of the apparatus. This is programmed in such a way that the correction value is calculated during the deposition of a first portion of the multilayer structure, and is used during the depositions of a second portion of the multilayer structure.

BRIEF DESCRIPTION OF THE DRAWINGS

In the following text, an exemplary embodiment of the invention will be explained with reference to accompanying drawings. In the drawings.

DETAILED DESCRIPTION

Figure 1:
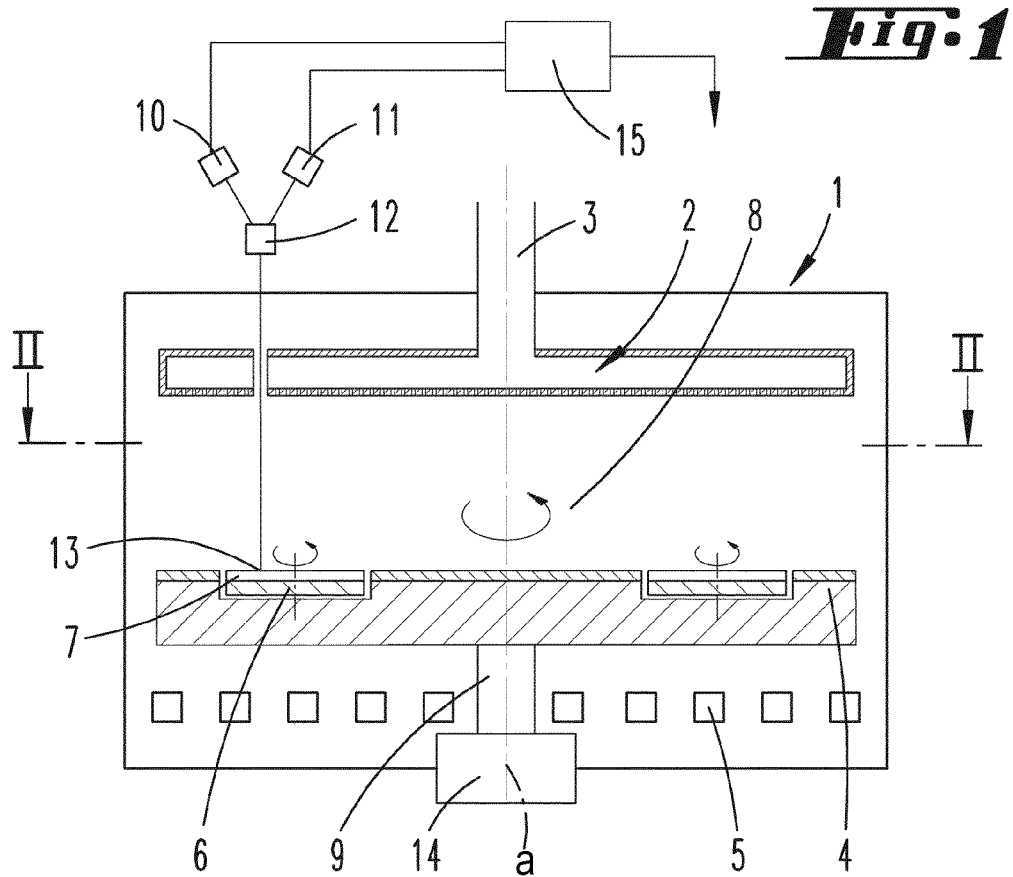
FIG. 1 depicts a schematic representation of a cross-section of an apparatus for performing the method.
Figure 2:
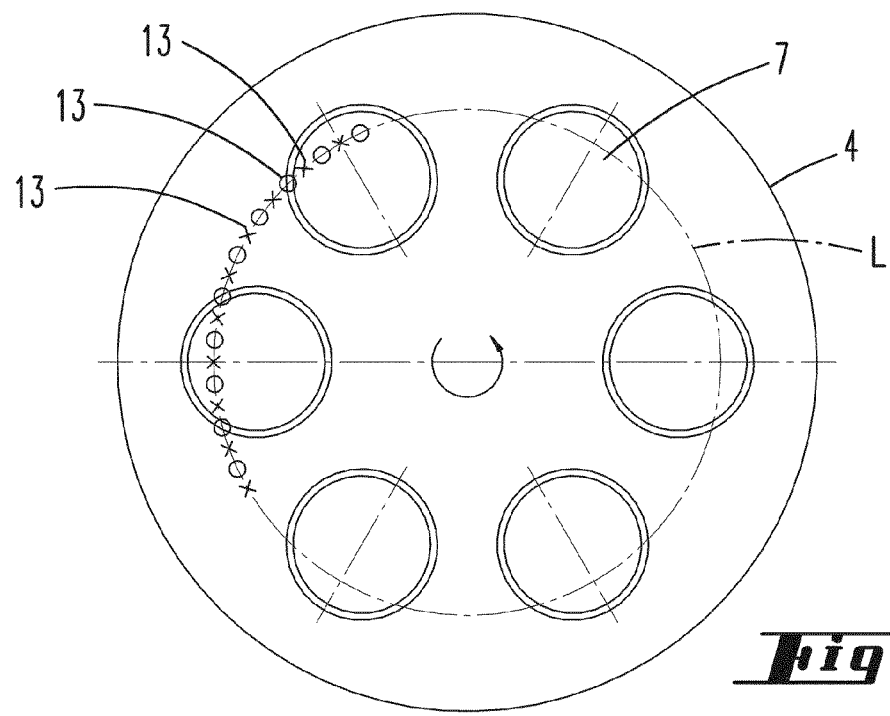
FIG. 2 depicts schematically a cross-section according to the line II-II in FIG. 1.

The CVD reactor represented in FIGS. 1 and 2 has a reactor housing 1, a heating device 5 arranged therein, a susceptor 4 arranged above the heating device 5, and a gas inlet element 2 for feeding in for example TMGa, TMAl, $NH_3$, $AsH_3$, $PH_3$ and $H_2$. The susceptor 4 is rotated about a vertical axis of rotation, a, with the aid of a rotary drive device 14. For this purpose, a drive shaft 9 is connected both to the rotary drive device 14 and to the underside of the susceptor 4.

Substrates 7 are positioned on the horizontal surface of the susceptor 4 facing away from the heating device 5. Substrate holders 6 are provided, on which the substrates 7 lie. The substrates 7 lie radially outside the axis of rotation, a, and are held in position by substrate holders 6.

Two measuring apparatuses may be provided. An emissivity measuring device 10 can be formed by a pyrometer. A reflectance measuring device 11 can also be formed by a pyrometer. A beam splitter 12 may be provided, with an input beam can be divided onto the two measuring apparatuses 10, 11. The beam path meets the substrate 7 at a measurement point 13. FIG. 2 indicates that the measurement point 13 passes over all of the substrates 7 during a revolution of the susceptor 4.

Figure 3:
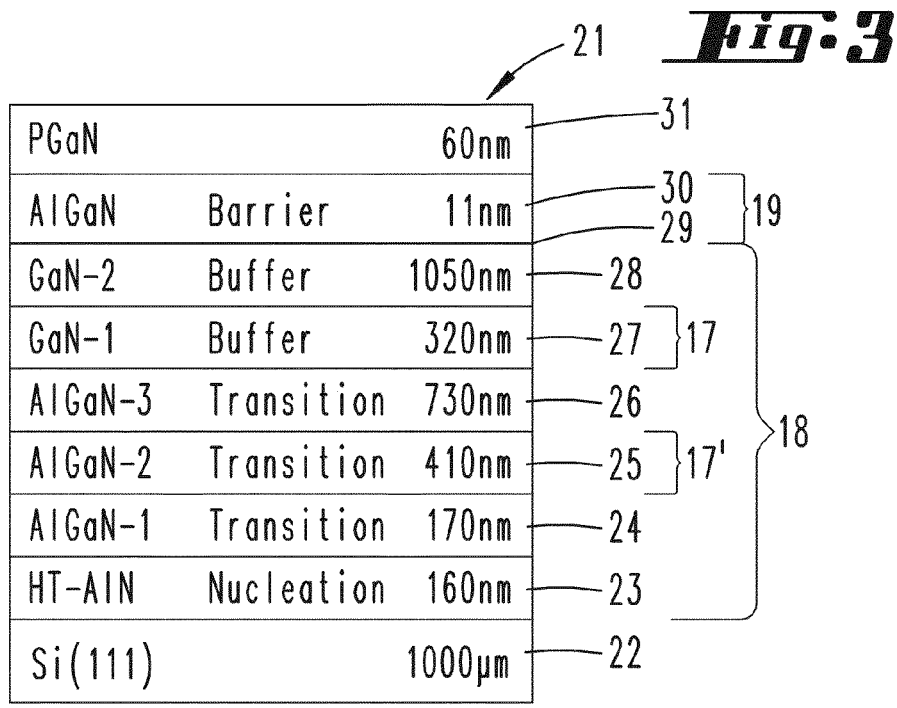
FIG. 3 depicts an exemplary embodiment of a multilayer structure 21 deposited on a silicon substrate 22.

FIG. 3 shows a multilayer structure 21 with layers that are deposited one after another in several consecutive coating steps in a coating process. First, a nucleation layer 23 of AlN or InN is deposited on the silicon substrate 22. Then, a first AlGaN layer 24 is deposited on the nucleation layer 23, followed by a second AlGaN layer 25 and on this a third AlGaN layer 26. The three AlGaN layers 24 to 26 constitute transition layers. The aluminium content of the transition layers may be reduced incrementally.

Then, a first buffer layer 27 of GaN is deposited on the transition layers 24 to 26. The layer may be C-doped. Then, a second buffer layer 28, also of GaN, which may be undoped, is deposited on the first buffer layer 27.

The region of the multilayer structure 21, starting with the nucleation layer 23 and extending as far as the top region of the second buffer layer 28 is designated the first portion 18 of the multilayer structure 21. The top region of the buffer layer 28, which does not belong to the first portion 18, has a minimum thickness of about 100 nm.

A barrier layer 30 of AlGaN or AlInN is deposited on the second buffer layer 28. At least the bottom region of the barrier layer 30, of which the thickness may be about one tenth the thickness of the second buffer layer 28, is designated the second portion 19 of multilayer structure 21, similarly to the top region of the second buffer layer 28.

In FIG. 3, two regions designated with reference numerals 17, 17' are represented, during which the correction values are calculated. In the illustration according to FIG. 3, these correction value determination phases 17, 17' are separated spatially from each other and from the second portion 19. During deposition of the multilayer structure, the correction value determination phases 17, 17' are separated temporally from each other and from the start of the deposition of the second portion 19. An optional optimization of the correction value may still be carried out during the time of the deposition of the second portion 19, that is to say while the correction value is being used.

Then, a cover layer 31 of P-doped GaN is deposited on the barrier layer 30. However, the cover layer 30 and the second buffer layer 28 may also be counted as part of the second portion 19 of the multilayer structure 21.

An actual value $T_C$ of a substrate temperature is calculated during the deposition of the first portion 18. This may be done according to the following formula:

$$T_C = \frac{B}{\log E - A + \log(1 - R)} \quad (3)$$

However, the actual value $T_C$ may also be calculated according to the following formula:

$$T_C = \frac{B}{\log E - A + \log(1 - \gamma \cdot R)} \quad (5)$$

The terms in the formulas shown above represent the following variables:

$T_C$: Emissivity-corrected temperature
E: Calibrated signal of the measurement of the thermal emission (linear relationship between measurement signal and incident radiation)
R: Calibrated signal of the reflectance measurement (linear relationship between measurement signal and incident radiation)
$T_{cal}$, $S_{cal}$: Calibration parameters for determining the raw temperature
$R_{cal}$: Calibration parameter of the reflectance measurement $\lambda$: Wavelength of pyrometer and reflectance measurement
$c_2$: Second radiation constant Parameters A and B as well as the correction value $\gamma$ are adapted or calculated.

Figure 4:
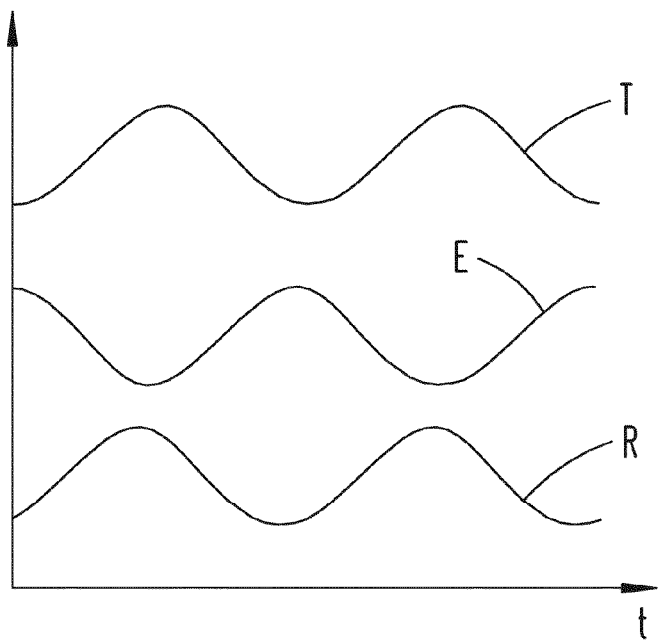
FIG. 4 depicts schematically a temporal curve of the reflectance value R and the emissivity value E during a correction value determination phase and the temperature calculated therefrom without correction.

The reflectance of the layer is measured with the emissivity measuring device 10. Because of the constantly growing layer and changing reflections and layer thicknesses, the emissivity value E has an oscillating pattern, shown schematically in FIG. 4. The reflectance value R measured with the reflectance measuring device 11 also has an oscillating pattern for the same reasons. The actual value $T_C$ of the substrate temperature calculated therefrom also has an oscillating pattern. The actual value $T_C$ is used to regulate the substrate temperature against a target value $T_S$. This is why the physical temperature T of the substrate 7, which is represented in FIG. 4, also has an oscillating pattern. The period length of the oscillation curve is about 100 to 200 seconds with a wavelength of 950 nm and a refraction index n of about 3.

A correction value $\gamma$ or multiple intermediate correction values $\gamma$ are calculated in one or more correction value determination phases 17, 17' during the deposition of the first portion. The length of a correction value determination phase 17, 17' is at least equal to the time of one quarter of a period length. The temperature T of the substrate surface is regulated against a target value before the correction value determination phase 17, 17'. Because of the oscillation of the emissivity E and the reflectance R, as represented in FIG. 4, the temperature oscillates. The physical substrate temperature T is kept constant immediately before the correction value determination phase 17, 17' by interrupting the regulation. The temperature T reaches a steady state. In the correction value determination phase 17, 17', the heating device 5 is not regulated, but is energized with constant power. The measured value of emissivity E and reflectance R oscillates. But the temperature T remains constant. With the aid of the computing device 15, in particular using the formula (5), a correction value $\gamma$ is varied in such manner that the calculated temperature $T_C$ varies as little as possible. In this context, calibration parameters A and B are determined at the same time.

The calculation of correction value $\gamma$ may also be carried out after the correction value determination phase 17, 17'. The essential point is that measurement values are recorded in the correction value determination phase with which the calculation can be carried out.

If multiple correction value determination phases 17, 17' are provided, the correction value $\gamma$ can be optimized incrementally.

Figure 5:
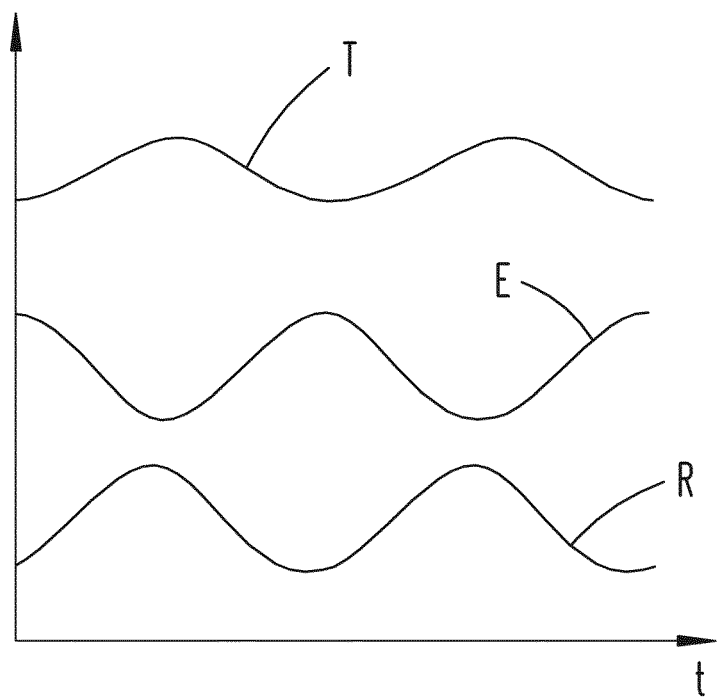
FIG. 5 depicts in the manner of the representation according to FIG. 4 the curve of reflectance value R, emissivity value E, and the corrected temperature calculated therefrom during deposition of the active region of the multilayer structure with correction. The temperature is represented here as weakly oscillating. Ideally, the temporal curve of the temperature has no or only minor fluctuations, and would thus be a straight line in the diagram.

For the deposition of a boundary layer 29 between the top buffer layer 28 and barrier layer 30 located above it, in a second portion of the multilayer structure 19, also in a correction phase, the actual value of the substrate temperature is calculated according to formula (5). The physical temperature T of the substrate surface then progresses approximately as shown in FIG. 5. The oscillation has a smaller amplitude than that of the oscillation of the temperature curve illustrated in FIG. 4. Ideally, the temperature curve no longer has any oscillation at all. Therefore, it is provided in particular that an emissivity-corrected pyrometry is carried out during the deposition of the buffer layer 28 and the barrier layer 30 in order to determine the actual value of the temperature of the substrate surface, wherein the correction value $\gamma$ was obtained immediately beforehand, during the same deposition process.

FIG. 2 shows a total of six substrates 7. For each substrate 7, an individually assigned correction value $\gamma$ can be calculated, which is then used during the deposition of the second portion 19 of the multilayer structure 21.

The above explanations are intended to explain all the inventions included overall in the filing, each of which also advances the state of the art, at least through the following feature combinations, wherein two, more, or all of these feature combinations can also be combined, specifically:

A method which is characterized in that the correction value γ is determined during the deposition of the first portion, that takes place immediately before the deposition of the second portion 19.

A method which is characterized in that the first portion 18 of the multilayer structure 21 includes a multiplicity of buffer- or transition layers 23 to 28, and/or that the second portion 19 of the multilayer structure 21 has least one barrier layer 30.

A method which is characterized in that the measurement of the emissivity value E and/or of the reflectance value R is carried out at a wavelength A in a range between 800 nm and 1000 nm, and/or that the substrate 22 is opaque for light with wavelength A, at which the emissivity value E and/or the reflectance value R is measured, and the layers of the first portion and the second portion 19, but at least some layers in the region of the first and second portion 19 are transparent or semi-transparent.

A method which is characterized in that immediately before the determination of the correction value γ the substrate 22 is heated to a temporally constantly maintained, measured temperature $T_M$, at which the correction value γ is determined, and/or that the substrate 22 is heated without temperature regulation with constant heat output during a correction value determination phase 17, 17'.

A method which is characterized in that the emissivity value E and the reflectance value R changes periodically during the deposition of the multilayer structure 21, wherein the temporal length correction value determination phase 17, 17' is at least equal to a quarter of the period and/or maximally one half or an entire period, and/or maximally 100 seconds.

A method which is characterized in that the determination of the correction value γ is carried out in a number of correction value determination phases 17, 17', each being completed temporally consecutively after a pause, wherein an intermediate correction value is determined in each case, wherein the correction value γ is calculated using the intermediate correction values, and/or an intermediate correction value is determined in order to optimize the correction value γ during the deposition of the second portion 19.

A method which is characterized in that the substrate 22 is a silicon substrate and/or that the multilayer structure 21 contains layers of elements from main groups III and V, and/or that the one or more buffer or transition layers 23 to 28, during whose deposition the correction value γ is determined, contains gallium, nitrogen and/or aluminium, and/or that the barrier layer 10 is an AlGaN layer or an AlInN layer, and/or that the first portion 18 includes at least one layer 23 to 26 that is similar to at least one layer 30 of the second portion 29 in terms of its composition.

A method which is characterized in that in a reactor housing 1 of a CVD reactor multiple substrates 22 on a susceptor 4 which is heated by a heating device 5 are coated simultaneously with a multilayer structure 21, wherein an individual correction value γ is calculated for each of the substrates 22, and an individual actual value $T_C$ of a temperature of the substrate 22 is calculated with the individual correction value γ.

An apparatus which is characterized in that the computing device 15 is programmed in such manner that the correction value γ is determined during the deposition of a first portion 18 of the multilayer structure 21 on the substrate 22, immediately before the deposition of the second portion 19 of the multilayer structure 21 on the first layer arrangement.

All disclosed features (individually, but also in combination with each other) are essential to the invention. The content of disclosure of the associated/accompanying priority documents (copy of the previous application) is herewith also incorporated in the disclosure of the application in its entirety, also for the purpose of including features of these documents in claims of the present application. Even without the features of a referenced claim, the subordinate claims with their features characterize stand-alone inventive further developments of the state of the art, in particular with a view to filing divisional applications on the basis of these claims. The invention described in each claim may additionally include one or more of the features presented in the preceding description, in particular those designated with reference numerals and/or presented in the list of reference signs. The invention also relates to design forms in which some of the features specified in the preceding description are not realized, in particular to the extent that they are evidently not essential for the respective intended use or can be replaced by other means with technically equivalent function.

LIST OF REFERENCE SIGNS

1 Reactor housing
2 Gas inlet element
3 Gas supply line
4 Susceptor
5 Heating device
6 Substrate holder
7 Substrate
8 Process chamber
9 Drive shaft
10 Emissivity value measuring device
11 Reflectance value measuring device
12 Beam splitter
13 Measurement point
14 Rotary drive device
15 Computing device
17 Correction value determination phase
17' Correction value determination phase
18 First portion of the multilayer structure
19 Correction phase, second portion of the multilayer structure
21 Multilayer structure
22 Substrate
23 Nucleation layer
24 Transition layer
25 Transition layer
26 Transition layer
27 Buffer layer
28 Buffer layer
29 Boundary layer, two-dimensional electron gas
30 Barrier layer
31 Cover layer
γ Correction value
λ Wavelength
a Axis of rotation
A Calibration parameter
B Calibration parameter
E Emissivity value
R Reflectance value $T_C$ Corrected temperature, temperature actual value
$T_M$ Measured temperature
$T_S$ Temperature target value
T Physical temperature

What is claimed is:

1. A method for emissivity-corrected pyrometry when coating a substrate (22) with a multilayer structure (21) in a process chamber (8) of a chemical vapor deposition (CVD) reactor, wherein a first portion (18) of the multilayer structure (21) includes first layers (23-28) and a second portion (19) deposited on the first portion (18) includes second layers (30, 31), the method comprising:
   depositing with the CVD reactor the first portion (18) on the substrate (22);
   during the deposition of one of the first layers (23-28) of the first portion (18) and prior to the deposition of the second layers (30, 31) of the second portion (19), determining by a computing device (15) a correction value (γ), wherein immediately before the determination of the correction value (γ), the substrate (22) is heated to a temporally constantly maintained measured temperature (TM), at which the correction value (γ) is determined;
   depositing with the CVD reactor the second portion (19), wherein the deposition of the first portion (18) is carried out immediately before the deposition of the second portion (19);
   during the deposition of a first one of the second layers (30, 31) of the second portion (19), measuring with at least one optical measuring device (10, 11) an emissivity value (E) and a reflectance value (R) from a surface of the first one of the second layers (30, 31), wherein a time sequence of emissivity values and a time sequence of reflectance values each exhibits an oscillating pattern, and the time sequence of reflectance values is phase shifted with respect to the time sequence of emissivity values;
   calculating by the computing device (15) an actual value ($T_C$) of a temperature of the substrate (22) from the emissivity value (E) and the reflectance value (R) using the correction value (γ); and
   controlling a heating device (5) to adjust the temperature of the substrate (22) to match a target value ($T_S$) using the actual value ($T_C$).

2. The method of claim 1, wherein at least one of:
   (i) the first layers (23-28) of the first portion (18) of the multilayer structure (21) includes a plurality of buffer or transition layers, or
   (ii) the second layers (30, 31) of the second portion (19) of the multilayer structure (21) includes at least one barrier layer (30).

3. The method of claim 1, wherein the measurement of one or more of the emissivity value (E) or the reflectance value (R) comprises measuring light with a wavelength (λ) in a range between 800 nm and 1000 nm.

4. The method of claim 1, wherein the substrate (22) is non-transparent to light with a wavelength (λ) at which one or more of the emissivity value (E) or the reflectance value (R) is measured, and at least the second layers (30, 31) in the second portion (19) are transparent or semi-transparent.

5. The method of claim 1, further comprising during the determination of the correction value (γ), heating the substrate (22) with a constant heat output from the heating device (5) without regulating the temperature of the substrate (22).

6. The method of claim 1,
   wherein the time series of the emissivity values and the time series of the reflectance values oscillate in accordance with a period, and
   wherein a temporal length of a value determination phase (17, 17'), during which the correction value (γ) is determined, is between a quarter of the period and an entirety of the period.

7. The method of claim 1,
   wherein the determination of the correction value (γ) is carried out during a plurality of correction value determination phases (17, 17') that are performed one after another,
   wherein an intermediate correction value is determined in each of the correction value determination phases (17, 17'), and
   wherein the correction value (γ) is determined using the intermediate correction values.

8. The method of claim 1, wherein at least one of:
   (i) the substrate (22) is a silicon substrate, or
   (ii) the multilayer structure (21) includes layers of elements from main group III and main group V.

9. The method of claim 1,
   wherein the first layers (23-28) of the first portion (18) of the multilayer structure (21) include one or more buffer or transition layers, during whose deposition the correction value (γ) is determined, and
   wherein the one or more buffer or transition layers contains one or more of gallium, nitrogen or aluminium.

10. The method of claim 1, wherein the second layers (30, 31) of the second portion (19) of the multilayer structure (21) include a barrier layer (10) formed by an AlGaN layer or an AlInN layer.

11. The method of claim 1, wherein a composition of at least one of the first layers (23-26) of the first portion (18) is similar to a composition of at least one of the second layers (30) of the second portion (19).

12. The method of claim 1, wherein the substrate (22) is part of a plurality of substrates (22) contained in a reactor housing (1) of a chemical vapor deposition (CVD) reactor, the method further comprising simultaneously performing the method of claim 1 on each of the substrates (22).

13. The method of claim 1, further comprising:
   determining an intermediate correction value during the deposition of the second portion (19); and
   optimizing the correction value (γ) based on the intermediate correction value.

* * * * *